United States Patent
Chevallaz et al.

(10) Patent No.: US 9,203,414 B2
(45) Date of Patent: Dec. 1, 2015

(54) MEMS OSCILLATOR

(75) Inventors: Eric Chevallaz, Pompaples (CH); Marc Pastre, Saint-Sulpice (CH); Francois Krummenacher, Chatillens (CH); Maher Kayal, Saint-Sulpice (CH)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/347,889

(22) PCT Filed: Sep. 30, 2011

(86) PCT No.: PCT/EP2011/067198
§ 371 (c)(1),
(2), (4) Date: Mar. 27, 2014

(87) PCT Pub. No.: WO2013/044993
PCT Pub. Date: Apr. 4, 2013

(65) Prior Publication Data
US 2014/0225677 A1    Aug. 14, 2014

(51) Int. Cl.
*H03L 7/00*    (2006.01)
*G02B 26/10*   (2006.01)
*G02B 26/08*   (2006.01)
*G09G 3/34*    (2006.01)

(52) U.S. Cl.
CPC .............. *H03L 7/00* (2013.01); *G02B 26/0841* (2013.01); *G02B 26/105* (2013.01); *G09G 3/346* (2013.01)

(58) Field of Classification Search
CPC ........................................................ H03L 7/00
USPC ............................................... 331/66; 372/20
See application file for complete search history.

(56) References Cited

U.S. PATENT DOCUMENTS

| 7,173,749 B2 * | 2/2007 | Maleki et al. ................. 359/239 |
| 2008/0055689 A1 | 3/2008 | Mochizuki |
| 2012/0063474 A1 * | 3/2012 | Ayotte et al. .................... 372/20 |

FOREIGN PATENT DOCUMENTS

| EP | 1191678 A2 | 3/2002 |
| JP | 2002277809 A | 9/2002 |

* cited by examiner

*Primary Examiner* — Joseph Chang
(74) *Attorney, Agent, or Firm* — Kacvinsky Daisak Bluni PLLC

(57) ABSTRACT

A device comprising, a mirror which is configured to oscillate in response to an oscillation signal, wherein the device is configured such that oscillation of the mirror will induce a signal; and a circuit in operable cooperation with the mirror such that an induced signal can be measured by the circuit and wherein the circuit is configured to provide an oscillation signal proportional to the measured induced signal; wherein the device is configured such that the mirror can receive the oscillation signal so that the oscillation signal is filtered due to oscillation limitations of mirror, to provide a filtered signal.

15 Claims, 6 Drawing Sheets

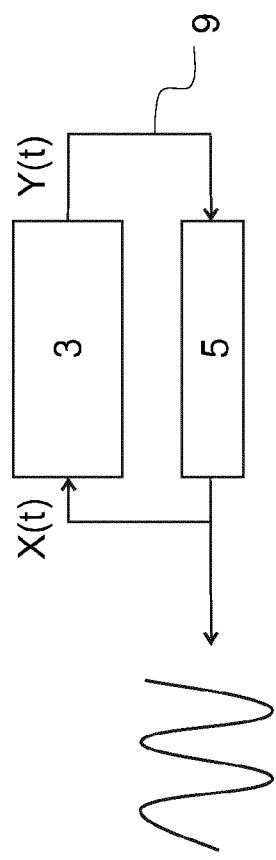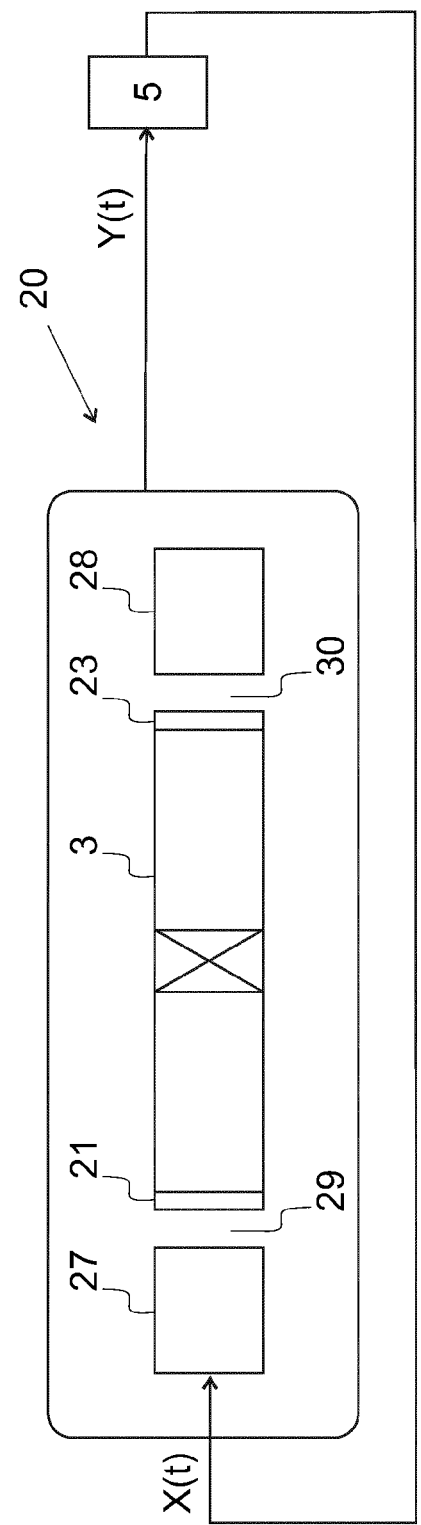

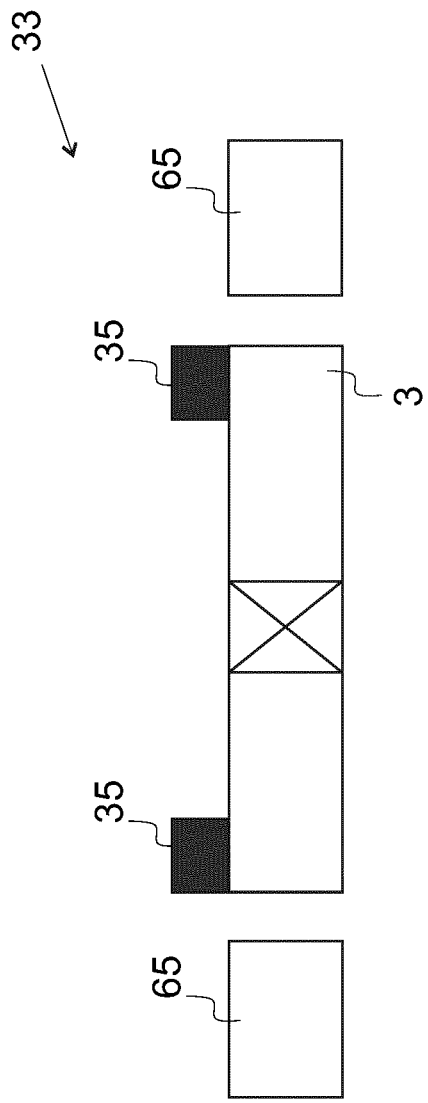
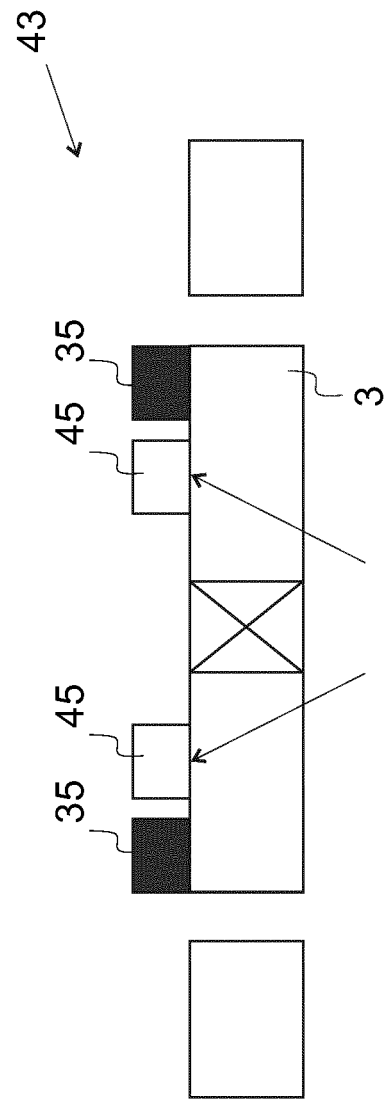

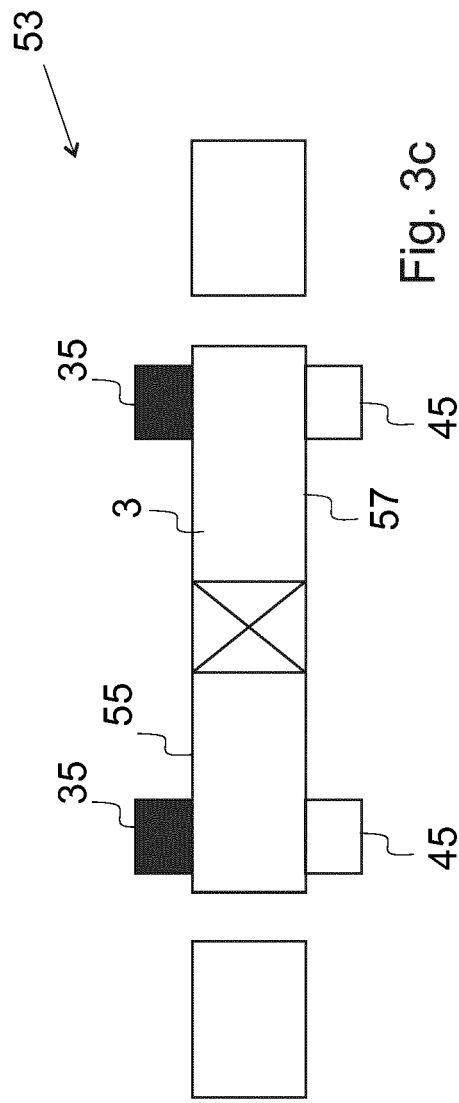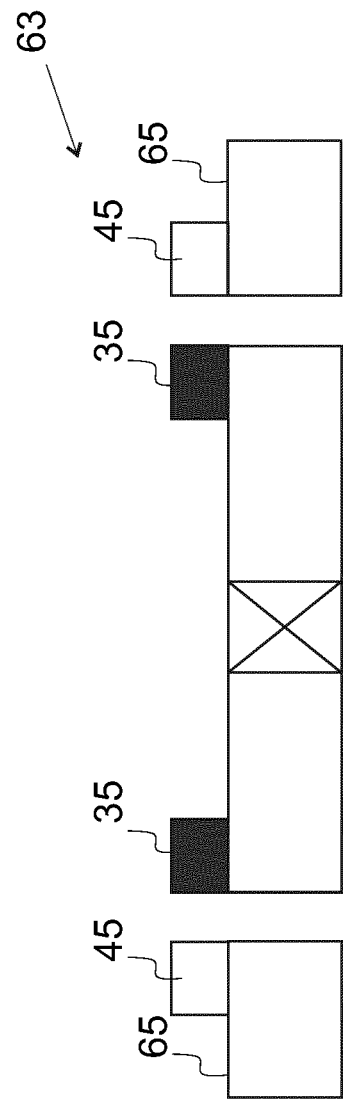

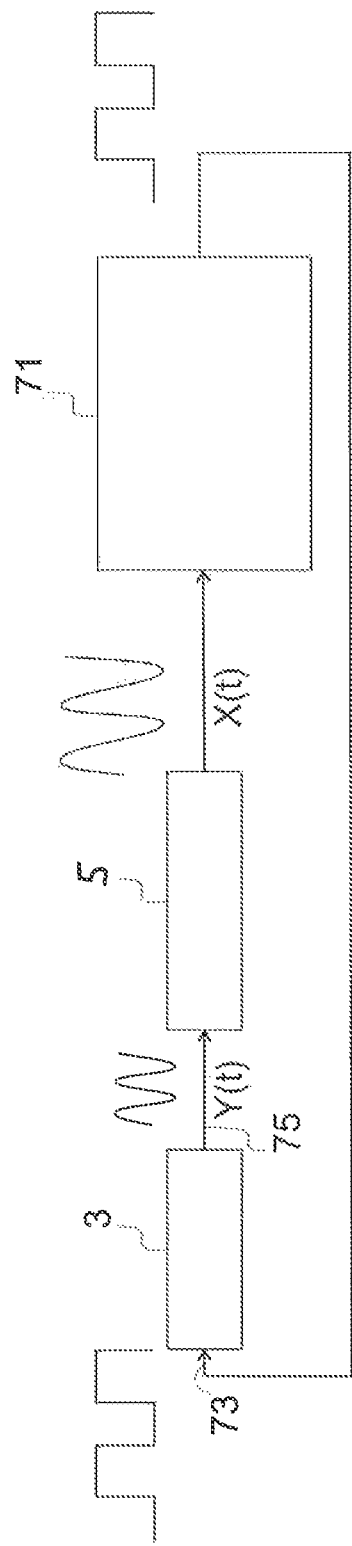
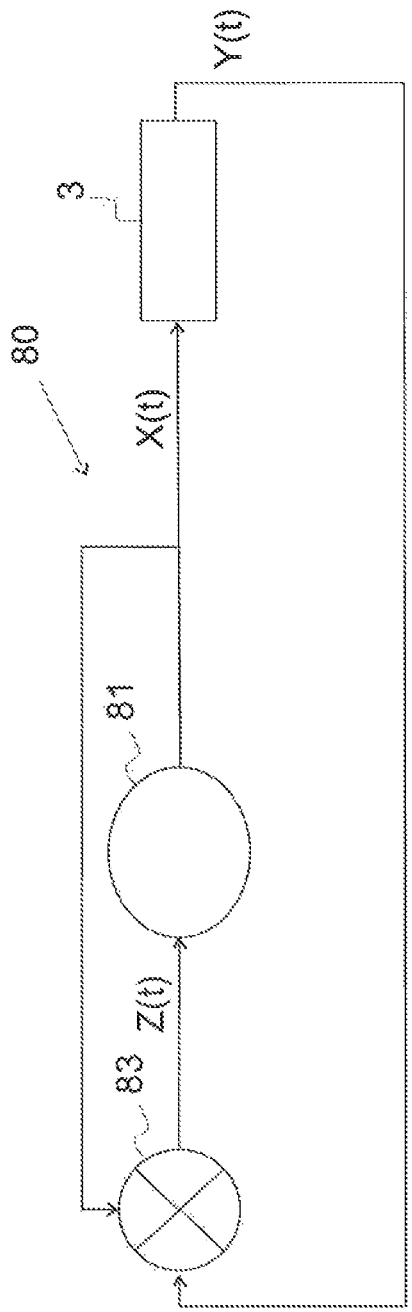

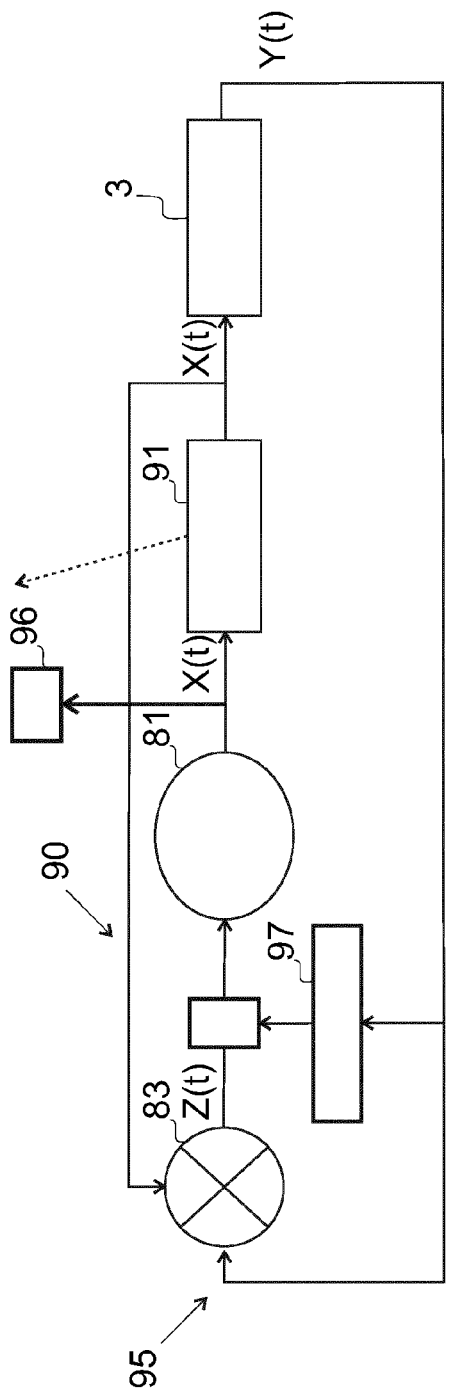

MEMS OSCILLATOR

FIELD OF THE INVENTION

The present invention concerns a device which provides a filtered signal; and in particular, but not exclusively, a device which comprises an oscillating mirror which filters a signal to provide a filtered signal which has frequency equal to the resonant frequency of oscillation of the mirror.

DESCRIPTION OF RELATED ART

Projections systems often comprise one or more mirrors which oscillate to project consecutive laser pulses, each pulse defining consecutive pixels of an image, onto a display screen to define a projected image. A laser modulator modulates a laser to provide the consecutive pulses which define consecutive pixels of the projected image. To display a well defined sharp image, it is necessary that the oscillation of the one or more mirrors is synchronised with the laser modulator. It is difficult to obtain precise synchronisation between the oscillation of the one or more mirrors and the laser modulator.

Additionally, as the projection systems operate, temperature variations will occur within the system e.g. the one or more mirrors will increase in temperature. These temperature variations will further impact on the oscillations of the one or more mirrors to change the frequency of oscillations. Furthermore, ageing and general deterioration of the projection system will further impact on the oscillations of the one or more mirrors to change the frequency of oscillations. Thus, temperature variations within the projection systems and ageing of the projection systems, make it more difficult to achieve precise synchronisation between the oscillation of the one or more mirrors and the laser modulator.

In order to achieve precise synchronisation between the oscillation of the one or more mirrors and the laser modulator, the position and phase of the one or more oscillating mirrors must be accurately detected, and the one or more mirrors should tend towards oscillating at their resonant frequency. Accurate detection of the position and phase of the one or more oscillating mirrors can be difficult to achieve.

Also, even if the position and phase of the one or more oscillating mirrors is accurately detected, problems can arise. A sensing signal containing the position and phase information is usually transmitted to a digital module which uses the sensing signal to generate a clock signal that will synchronise the laser modulator. However, the circuitry through which the sensing signal will pass as it is transmitted to the digital module, and the digital module itself, can delay the sensing signal such that it no longer accurately represents the physical position and phase of the one or more oscillating mirrors.

It is an aim of the present invention to obviate, or mitigate, one or more of the above-mentioned disadvantages.

BRIEF SUMMARY OF THE INVENTION

According to the invention, these aims are achieved by means of a device comprising, a mirror which is configured to oscillate in response to an oscillation signal, wherein the device is configured such that oscillation of the mirror will induce a signal; and a circuit in operable cooperation with the mirror such that an induced signal can be measured by the circuit and wherein the circuit is configured to provide an oscillation signal proportional to the measured induced signal; wherein the device is configured such that the mirror can receive the oscillation signal so that the oscillation signal is filtered due to oscillation limitations of mirror, to provide a filtered signal.

As the oscillation signal if filtered by the mirror, the resulting filtered signal, which represents an output of the device, will be precisely in phase with the mirror oscillations i.e. the filtered signal will precisely represent the phase of the oscillating mirror. Thus, filter signal can be used to clock a laser modulator in a projection system to achieve precise synchronisation between the oscillation of the mirror and the laser modulator.

The circuit may comprise an amplifier. The amplifier may be arranged to be in operable cooperation with the mirror such that the induced signal can be amplified by the amplifier to provide an oscillation signal proportional to the measured induced signal. The device may be configured such that the mirror can receive the oscillation signal provided by the amplifier.

Furthermore, as the induced signal is amplified by an amplifier to provide an oscillation signal, the mirror can receive an oscillation signal which has sufficient amplitude and frequency to oscillate the mirror at its resonant frequency.

The filtered signal may define the included signal.

The device may comprise at least one first electrode which cooperates with the mirror and at least a second electrode which cooperates with a fixed part of the device, wherein the first and second electrodes define a capacitor.

The capacitance of the capacitor may change as the mirror oscillates. In this case the induced signal may be an induced current, charge or voltage which results from the changing capacitance as the mirror oscillates.

The device may comprise a plurality of electrodes which define a plurality of capacitors.

The device may comprise one or more magnets and at least one coil which is configured such that it will conduct the induced signal as the mirror oscillates.

The device may comprise a single coil which is attached to the mirror, wherein the single coil is configured to conduct both the oscillation signal and the induced signal as the mirror oscillates. Oscillation of the mirror moves the coil within the magnetic field of the one or more magnets to provide the induced signal. The induced signal may be an induced voltage signal.

The device may comprise a first and second coil, wherein the first coil is configured to conduct the oscillation signal and the second coil is configured to conduct the induced signal.

The first and second coils may be attached to a part of the device which oscillates as the mirror oscillates.

The first and second coils may be arranged in the device such to reduce cross coupling between the first and second coils. For example, the first and second coils may be arranged on opposite sides of a part of the device. For example, the first and second coils may be arranged on opposite sides of a part of the device which is configured to oscillate.

The device may further comprise a shield means which prevents cross coupling between the first and second coils. The device may further comprise a shield means which reduces cross coupling between the first and second coils. For example, the first and second coils may be arranged on opposite sides of the mirror so that the mirror defines the shield means, or on opposite sides of a component which oscillates as the mirror oscillates so that the component defines the shield means. Alternatively, a dedicated shield component may be provided which defines the shield means.

The first coil may be attached to a part of the device which oscillates as the mirror oscillates; and the second coil may be attached to a fixed part of the device, such that as the mirror oscillates, the magnetic field provided by the one or more magnets and the movement and the first coil which conducts the oscillation signal, can induce the induced signal in the second coil.

The device may comprise a circuit which is configured to remove a parasitic component in the filtered signal. The parasitic component in the filtered signal may have resulted from coupling between an input and output of the mirror. The circuit may be a comparator circuit.

The device may further comprise a voltage control oscillator which is operable to provide an oscillating signal which can effect oscillation of the mirror.

The device may further comprise a comparator circuit, which is configured to compare the induced signal with the oscillating signal provided by the voltage control oscillator and to provide a control signal which controls the voltage control oscillator to provide an oscillation signal which will adjust the oscillation of the mirror so that the mirror oscillates closer to the resonant frequency of the mirror.

The oscillating signal may define a clock signal for a circuit. The oscillating signal may define a clock signal for a circuit which is operable to control laser modulation (i.e. for a laser modulator).

The device may further comprise a means for dividing frequency of an oscillating signal which is provided by a voltage control oscillator.

The device may further comprise a rectifier means which is configured to modify a control signal which controls the voltage control oscillator so as to compensate for sinus movement of the mirror as the mirror oscillates.

The device may further comprise a switch device which is selectively operable to provide a constant signal. The switch device may be configured such that it is selectively operable in a hold mode or a sample mode. The device may further comprise a circuit, which is configured to, receive the induced signal and the oscillation signal provided by the circuit, and to compare the induced signal with the oscillation signal, and to provide a control signal based on the comparison which controls an oscillator circuit such that the oscillator circuit provides an oscillation signal which will adjust the oscillation of the mirror so that the mirror oscillates closer to the resonant frequency of the mirror.

The oscillator circuit may be configured such that the oscillating signal provided by the oscillator circuit, defines a clock signal for a circuit.

The device may further comprise a means for dividing frequency of an oscillating signal which is provided by the oscillator circuit.

The device may further comprise a rectifier means which is configured to modify the control signal which controls the oscillator so as to compensate for sinus movement of the mirror as the mirror oscillates.

The device may further comprise a switch device which is selectively operable to provide a constant signal According to a further aspect of the present invention there is provided a device comprising;

a mirror which is configured to oscillate in response to an oscillation signal, wherein the device is configured such that oscillation of the mirror will induce a signal;

an oscillator which is operable to provide an oscillating signal which can effect oscillation of the mirror; a comparator circuit, which is configured to compare the induced signal with the oscillating signal provided by the oscillator and to provide a control signal which controls the controlled oscillator to provide an oscillation signal which will adjust the oscillation of the mirror so that the mirror oscillates at the resonant frequency of the mirror.

The oscillator may be a controlled oscillator. The oscillator may be a voltage-controlled oscillator (VCO) or a current-controlled oscillator (ICO).

The oscillator may be configured such that the oscillating signal defines a clock signal for a circuit. The oscillating signal may define a clock signal for a circuit which is operable to control laser modulation.

The device may further comprise a means for dividing frequency of an oscillating signal which is provided by the oscillator.

The device may further comprise a rectifier means which is configured to modify the control signal which controls the oscillator so as to compensate for sinus movement of the mirror as the mirror oscillates.

The device may be arranged to cooperate with a rectifier means which is arranged to modify the oscillating signal so as to compensate for sinus movement of the mirror as it oscillates. The output of the rectifier means may define a clock signal for a circuit.

The output of the rectifier means may define a clock signal for a circuit which is operable to control laser modulation.

The rectifier means may comprise a micro processing unit.

The device may further comprise a switch device which is selectively operable to provide a constant signal. The switch device may cooperate with a comparator circuit. The switch device may be operable in a hold mode and a sample mode. In its hold mode the switch device may provide a constant signal which is equal to the signal which was output by a comparator circuit at the time the switch device was configured to operate in hold mode. In its sample mode, the switch device may provide a signal which tracks or follows the signal which was output by a comparator circuit. The constant signal is equal to an output of the comparator circuit. The constant signal may be equal to the control signal provided by the comparator circuit.

Any of the afore-mentioned devices may be used in a printer application. According to a further aspect of the present invention there is provided a printer apparatus comprising any one of the afore-mentioned devices.

The device according to any one of the preceding claims wherein the device is arranged such that the filtered signal defines a clock signal for a video streaming means.

BRIEF DESCRIPTION OF THE DRAWINGS

The invention will be better understood with the aid of the description of an embodiment given by way of example only, and illustrated by the figures, in which:

FIG. 1 is a schematic diagram representing the features of a device according to the present invention;

FIG. 2a provides side of a device 20 according to a possible embodiment of the present invention;

FIG. 2b provides a perspective view of the a possible configuration for the electrodes in the device shown in FIG. 2a;

FIGS. 3a-d each provides side views of possible further embodiments of devices according to the present invention;

FIG. 4 provides a schematic diagram a device according to a further possible embodiment of the present invention;

FIG. 5 provides a schematic diagram which represents a device according to a further aspect of the present invention;

FIG. 6 provides a schematic diagram which represents a device according to a further aspect of the present invention;

FIG. 7 provides a schematic diagram which represents a device according to a further aspect of the present invention, when used in a printer apparatus.

DETAILED DESCRIPTION OF POSSIBLE EMBODIMENTS OF THE INVENTION

Figure 2B:
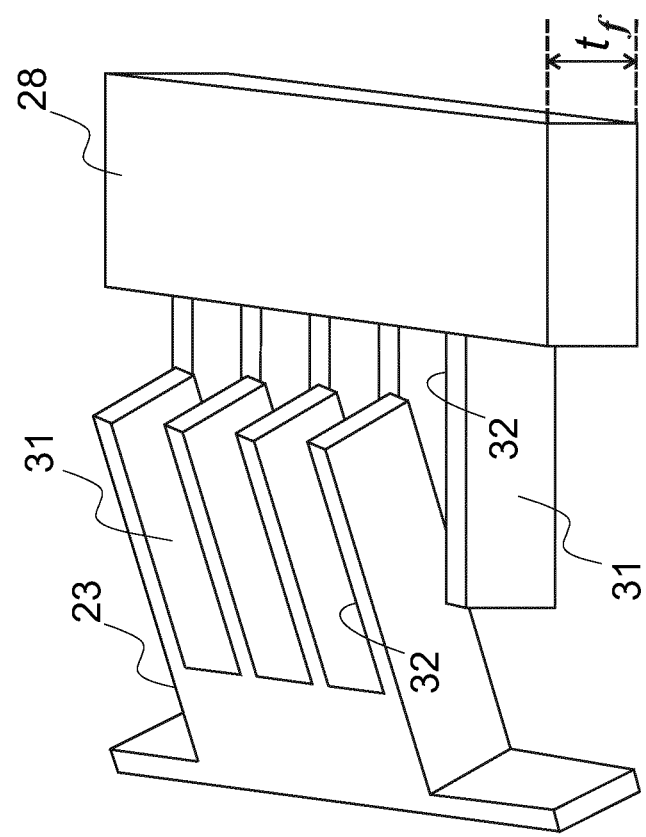

FIG. 1 provides a schematic diagram representing the features of a device 1 according to the present invention. The device 1 comprises a mirror 3 which is configured to oscillate in response to an oscillation signal (X(t)). In this particular example the mirror 3 is a MEMS micro-mirror, however it will be understood that any other suitable mirror may be used.

The device 1 is configured such that oscillation of the mirror 3 will induce a signal (Y(t)).

The device 1 further comprises an amplifier 5 in operable cooperation with the mirror 3 such that an induced signal (Y(t)) can be amplified by the amplifier 5 to provide an oscillation signal (X(t)). The device 1 is configured such that the mirror 3 can receive the oscillation signal (X(t)) provided by the amplifier 5 so that the oscillation signal (X(t)) is filtered due to oscillation limitations of the mirror 3, to provide a filtered signal (Y(t)). Thus, the mirror 3 is incorporated in an operational loop 9 defined by the mirror 3 and amplifier 5; and the mirror 3 operates as a filter in the operational loop 9 to filter an oscillation signal (X(t)) output from the amplifier 5.

As the induced signal (Y(t)) is amplified by the amplifier to provide an oscillation signal (X(t)), the mirror 3 can receive an oscillation signal which has sufficient amplitude to oscillate the mirror 3 with a predefined amplitude of oscillation.

As the oscillation signal is filtered by the mirror 3, the resulting filtered signal (Y(t)), which represents an output of the device 1, will be precisely in phase with the mirror oscillations i.e. the filtered signal (Y(t)) will precisely represent the phase of the oscillating mirror 3. In this particular example the mirror 3 will oscillate at its resonant frequency, thus the resulting filtered signal (Y(t)) will have a frequency equal to the resonant frequency of oscillation of the mirror 3. The filtered signal (Y(t)) can be used to clock a laser modulator in a projection system to achieve precise synchronisation between the oscillation of the mirror 3 and the laser modulator.

The mirror 3 as used in the device 1, can take any suitable form. Actuation of the oscillation of the mirror 3 can be effected using any suitable means. For example, an electrostatic actuation means, magnetic actuation means; piezoelectric actuation means; and/or thermal actuation means, may be used to actuate oscillation of the mirror 3.

FIG. 2a provides side of a device 20 according to a possible embodiment of the present invention.

The device 20 comprises all of the features of the device 1 shown in FIG. 1 and like features are awarded the same reference numbers.

The device 20 uses an electrostatic means to actuate oscillation of the mirror 3. In the device 20 the electrostatic means is defined by a first and second electrodes 21,23 which are secured at opposite edges 25,26 of the mirror 3, and third and fourth electrodes 27,28 which are located on a fixed part of the device 20. The first and second electrodes 21,23 are configured to cooperate with a third and fourth electrodes 27,28. The first and second electrodes 21,23 and third and fourth electrodes 27,28 cooperate to define capacitors 29,30.

FIG. 2b provides a perspective view of the a possible configuration for the first and second electrodes 21,23 and third and fourth electrodes 27,28 (only the second electrodes 23 and fourth electrodes 28, are shown for simplicity). As shown in FIG. 2b each electrode 21,23,27,28 comprises spaced projections 31; the projections on each of the first and second electrodes 21,23 are offset from the projections on each of the third and fourth electrodes 27,28, thus allowing the projections on each of the first and second electrodes 21,23 to pass through spaces 32 that exist between the projections on each of the third and fourth electrodes 27,28, as the mirror 3 oscillates.

In use the mirror 3 oscillates. As the mirror 3 oscillates the distance between the first and second electrodes 21,23 and third and fourth electrodes 27,28, respectively, will vary; accordingly the capacitance provided by capacitors 29,30 will vary.

As the capacitance in capacitor 30 varies, induced current (Y(t)) will flow in the fourth electrode 28. The induced current (Y(t)) will be received by the amplifier 5 where it is amplified before being transmitted to the third electrode 27 to provide an oscillation signal (X(t)). Thus, in this particular embodiment the induced signal (Y(t)) is an induced current signal (Y(t)).

The third electrode 27 is charged by the oscillation signal (X(t)) which is output from the amplifier 5. The charging of the third electrode 27 will in turn effect charging of the first electrode 25 on the mirror 3; once the first electrode 21 on the mirror 3 is charged, it will provide a current will causes the mirror 3 to oscillate.

FIGS. 3a-d each provides side views of possible further embodiments of devices according to the present invention. In each of the devices shown in FIGS. 3a-d a magnetic means is used to actuate oscillation of the mirror 3.

FIG. 3a provides a side view of a device 33. The device 33 comprises all of the features of the device 1 shown in FIG. 1 and like features are awarded the same reference numbers.

The device 33 comprises a magnet (not shown) which can be located on the mirror 33 or on a fixed part 65 of the device 33. The device 33 further comprises a coil 35 which is fixed to the mirror 3. The magnet may be located at any position on the device 33; however the magnet should be positioned such that the coil 35 mounted on the mirror 3 is within the magnetic field produced by the magnet; this will ensure that when the coil 35 conducts an alternating current/voltage the mirror 3 will be forced to oscillate.

In use an oscillation signal (an alternating current/voltage signal) is passed through the coil 35 thus forcing the mirror 3 to oscillate. As the mirror 3 oscillates, the movement of the coil 35 within the magnetic field of the magnet induces signal in the coil 35 (a current/voltage signal). Thus, the coil 35 conducts both the oscillation signal which is used to force the mirror to oscillate, and the induced signal (induced current/voltage) which is generated in the coils 35 due to movement of the coil within the magnetic field.

Thus, the induced signal (induced current/voltage) which results from the coil oscillating within the magnetic field, defines the induced signal (Y(t)) which is transmitted to the amplifier 5. The output of the amplifier defines the oscillation signal (X(t)).

FIG. 3b provides a side view of a device 43. The device 43 comprises all of the features of the device 33 shown in FIG. 3a and like features are awarded the same reference numbers.

The device 43 further comprises a second coil 45. The second coil is mounted on the mirror 3.

During operation, an oscillation signal (an alternating current/voltage signal) is passed through the first coil 35 thus forcing the mirror 3 to oscillate within the magnetic field provided by the magnet (not shown). As the mirror 3 oscillates, the movement of the second coil 45 within the magnetic field of the magnet induces signal (a current/voltage) in the second coil 45. Thus, the first coil 35 conducts the oscillation signal which is used to force the mirror 3 to oscillate, and the second coil 45 conducts the induced signal (induced current/voltage).

The induced signal (current/voltage) which results from the second coil 45 oscillating within the magnetic field, and which is conducted in the second coil 45, defines the induced signal (Y(t)) which is transmitted to the amplifier 5. The output of the amplifier defines the oscillation signal (X(t)) which is passed through the first coil 35 to force the mirror 3 to oscillate within the magnetic field.

FIG. 3c provides a side view of a device 53. The device 53 comprises all of the features of the device 43 shown in FIG. 3b and like features are awarded the same reference numbers.

However, in the device 53, the first and second coils 35,45 are isolated from each other; the first and second coils 35,45 are each located on opposite sides 55, 57 of the mirror 3. Such an arrangement can reduce cross coupling between the coils 35, 45. The first and second coils 35,45 could be isolated from each other using other means; for example the device 53 may comprise a shield means which is arranged in the device 53 to prevent, or reduce, cross coupling between the coils 35,45.

FIG. 3d provides a side view of a device 63 according to a further possible embodiment of the present invention. The device 63 comprises all of the features of the device 43 shown in FIG. 3b and like features are awarded the same reference numbers.

In the device 63, the second coil 45 is located on a fixed part 65 of the device 63. The second coil 45 is arranged within the device 63 such that it lies within the magnetic field provided by the magnet in the device 63.

In use, as the mirror 3 oscillates, the first coil 35, which conducts the oscillation signal (X(t)), is moved relative to the second coil 45. Combined with the magnetic field, the movement of the first coil 35 relative to the second coil 45, induces a signal in the second coil 45. The signal induced in the second coil defines the induced signal (Y(t)) which is transmitted to the amplifier 5. The output of the amplifier defines the oscillation signal (X(t)) which is passed to the first coil 35 to force the mirror 3 to oscillate within the magnetic field.

FIG. 4 provides a schematic diagram a device 70 according to a further possible embodiment of the present invention. The device 70 shown in FIG. 4 includes the same features as the device 1 shown in FIG. 1 and like features are awarded the same reference numerals.

The device 70 further comprises a comparator circuit 71. The comparator circuit 71 is configured to receive an output of the amplifier 5 (X(t)); the output of the amplifier 5 is an amplified filtered signal (X(t)) (i.e. filtered by the mirror 3). The comparator circuit 71 is configured to remove a parasitic component in the amplified filtered signal (X(t)). The parasitic component in the amplified filtered signal (X(t)) may have resulted from coupling between an input 73 and output 75 of the mirror 3; for example coupling which takes place between the first and second electrodes 21,23 and/or the third and fourth electrodes 27,28, in the device 20, shown in FIG. 2.

The comparator circuit 71 can remove a parasitic component in the amplified filtered signal (X(t)) when the actuation is done using a saturated signal. The actuation signal couples a constant signal during half an oscillation period, whereas the phase information is a sinewave.

In each of the embodiments described above, the oscillation signal (X(t)) (which is effectively, the induced signal, amplified by the amplifier) can be used as a clock for a laser modulation system, such as a laser modulation system in a projector, to achieve precise synchronisation between the oscillation of the mirror 3 and the laser modulator.

FIG. 5 provides a schematic diagram which represents a device 80 according to a further aspect of the present invention.

The device 80 comprises a mirror 3 which is configured to oscillate in response to an oscillation signal (X(t)), wherein the device 80 is configured such that oscillation of the mirror 3 will induce a signal (Y(t)).

Unlike the device 1 shown in FIG. 1, a voltage controlled oscillator 81 is provided. The voltage controlled oscillator 81 is operable to provide an oscillating signal (X(t)) which can effect oscillation of the mirror 3. The device 80 further comprises a comparator circuit 83, which is configured to compare the phase of the induced signal (Y(t)) which has resulted from the oscillation of the mirror 3, with the oscillating signal (X(t)) provided by the voltage control oscillator 81, and to provide a control signal (Z(t)) which controls the voltage controlled oscillator 81 such that the voltage controlled oscillator 81 provides an oscillation signal (X(t)) which will tend to adjust the oscillation of the mirror 3 so that the mirror 3 oscillates at the resonant frequency of the mirror 3.

In use, the voltage controlled oscillator 81 provides an oscillating signal which can effect oscillation of the mirror 3. Due to oscillation limitations of the mirror 3, the mirror 3 will oscillate at its resonant frequency. The oscillation of the mirror 3 at the resonant frequency will provide an induced signal (Y(t)) which is at the resonant frequency of oscillation of the mirror 3. The induced signal (Y(t)) is fed to the comparator circuit 83 where it is compared to the oscillation signal (X(t)) which is being provided by the voltage controlled oscillator 81. The comparator circuit 83 provides a control signal (Z(t)) which controls the voltage control oscillator 81 to provide an oscillation signal (X(t)) which will tend to adjust the oscillation of the mirror 3 so that the mirror 3 oscillates at the resonant frequency of the mirror 3.

The oscillating signal (X(t)) may define a clock signal for a circuit, such as a laser modulation circuit in a projector system.

FIG. 6 provides a schematic diagram which represents a device 90 according to a further aspect of the present invention.

The device 90 comprises the same features as the device 80 shown in FIG. 5, and like features are awarded the same reference numerals.

The device 90 further comprises a divider component 91 for dividing the frequency of an oscillating signal (X(t)) which is provided by the voltage control oscillator 81. The mirror 3, comparator circuit 83, voltage control oscillator 81 and divider component 91, define an operational loop 95.

In use, for example, if the oscillating signal (X(t)) which is provided by the voltage controlled oscillator has a frequency of 100 Mhz; the divider component 91 can divide the frequency of the oscillating signal (X(t)) by 5 for example, such that the mirror 3 receives an oscillating signal (X(t)) of 20 MHz. The 100 Mhz oscillation signal (X(t)) may be used for other applications which require signals of higher frequency; in this particular example the 100 Mhz oscillating signal is used as a clock for a laser modulator 96 of an image projection system (not shown). Having the oscillating signal (X(t)) which actuates oscillation of the mirror 3, as a multiple of a clock for the laser modulator 96 of the image projection system, is beneficial to achieving higher resolution for a projected image.

Furthermore, as the mirror 3 defines part of the operational loop 95, phase information and resonant frequency information of the oscillations of the mirror 3 can be obtained without the need for an additional external phase locked loop. Additionally, as the oscillating signal (X(t)) which is provided by the voltage controlled oscillator 81 is divided to provide the oscillating signal (X(t)) used to actuate oscillation of the mirror 3, no phase lock loops are required to generate a clock for the laser modulator 96 of the projection system.

Incorporating the divider 91 into the operational loop 95 ensures that an oscillating signal (X(t)) which is provided by the voltage controlled oscillator 81, does not need to be multiplied outside the operational loop 95 to provide a signal of high frequency required to modulate the laser modulator 96 of a projection system. Disadvantageously, multiplying the oscillating signal (X(t)) outside the operational loop 95, could result in changing the phase of the oscillation signal (X(t)) or could induce a delay in the oscillation signal (X(t)).

As shown in FIG. 6, the device 90 may further comprise a rectifier 97 which is configured to modify the control signal (Z(t)) which controls the voltage control oscillator 81. The rectifier 97 can modify the control signal (Z(t)) so as to compensate for sinus movement of the mirror 3 as it oscillates. A micro-processing unit may define the rectifier 97.

The rectifier 97 may form part of the operational loop 95, as shown in FIG. 6. However, it will be understood that the rectifier 97 may alternatively be arranged outside of the operational loop 95.

The devices 80, 90 shown in FIGS. 5 and 6, may be used in a printer apparatus. When used in a printer apparatus, preferably, the mirror 3 should be actuated by the oscillating signal (X(t)) to oscillate at a predetermined frequency, with a predetermined amplitude of oscillation, within a time period corresponding to a time period required to print one or more pages.

FIG. 7 provides a schematic diagram which represents a device 110 according to a further aspect of the present invention, when used in a printer apparatus (not shown).

The device 110 comprises the same features as the device 80 shown in FIG. 5, and like features are awarded the same reference numerals.

The device 110 further comprises, a phase detection circuit 111, which is configured to determine the phase of oscillations of the mirror 3 from the induced signal (Y(t)), which is induced when the mirror 3 oscillates.

The device 110 further comprises a switch device 113 which is selectively operable in a sample mode and hold mode. When operated in its hold mode, the output of the switch device 113 is held at a constant value which is equal to the output (Z(t)) of the comparator circuit 83 at the time the switch device 113 was configured to operate in its hold mode. When operated in its sample mode, the output of the switch device 113 will follow the output of the comparator circuit 83 i.e. the switch device 113 is transparent to the signal output (Z(t)) from the comparator circuit 83.

When output of the switch device 113 is held constant, the phase/frequency of the oscillation signal (X(t)) which is used to actuate oscillation of the mirror 3, is held constant; and thus the phase/frequency of the oscillations of the mirror 3 are held constant. However, during use, factors such as temperature increases and ware and tare, may change the frequency/phase of the oscillations of the mirror 3. Such changes in the frequency/phase of the oscillations of the mirror 3 can be detected the phase detection circuit 111.

During use, when the printing apparatus is printing a page, the switch device 113 is configured to operate in its hold mode; thus the output of the switch device 113 is held constant and the phase and frequency of oscillation of the mirror 3 is held constant. While the output of the switch device 113 is held constant, the phase of oscillations of the mirror 3 continues to be measured by the phase detection circuit 111. In the event that the phase/frequency of oscillations of the mirror 3 changes, such changes will be detected by the phase detection circuit 111.

If the phase detection circuit 111 detects that the phase/frequency of oscillation of the mirror 3 changes, the switch device 113 is reconfigured to operate in its sample mode. The output of the switch device 113 will then follow the output of the comparator circuit 83. The output of the comparator circuit 83 (Z(t)) will adjust the voltage control oscillator 81 so that the voltage control oscillator 81 provides an oscillation signal (X(t)) that will actuate the mirror 3 towards oscillating at its resonant frequency/phase. Once, the mirror 3 is oscillating at its resonant frequency/phase, the switch device 113 may be reconfigured again to operate in its hold mode.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A device comprising, a mirror which is configured to oscillate in response to an oscillation signal, wherein the device is configured such that oscillation of the mirror will induce a signal; and a circuit in operable cooperation with the mirror such that an induced signal can be measured by the circuit and wherein the circuit is configured to provide an oscillation signal in relation to the measured induced signal;

wherein the device is configured such that the mirror can receive the oscillation signal so that the oscillation signal is filtered due to oscillation limitations of mirror, to provide a filtered signal;

wherein the device further comprises a comparator circuit for comparing the phase or amplitude of the induced signal (Y(t)) which has resulted from the oscillation of the mirror, with the phase or amplitude of the oscillating signal (X(t)) provided by the circuit, and to provide a control signal (Z(t)) which controls the circuit such that the circuit provides an oscillation signal (X(t)) which will tend to adjust the oscillation of the mirror so that the mirror tends to oscillate at the resonant frequency of the mirror, wherein the comparator circuit is configured to compare the phase of the induced signal (Y(t)) with the phase of the oscillating signal (X(t)) by coupling directly the induced signal (Y(t)) with another oscillating signal (X(t)), wherein the coupling the induced signal (Y(t)) with said oscillating signal provides an oscillating signal composed of sine-waves when the phase of induced signal (Y(t)) and oscillating signal (X(t)) are equal.

2. A device according to claim 1, comprising, at least one first electrode which cooperates with the mirror and at least a second electrode which cooperates with a fixed part of the device, wherein the first and second electrodes define a capacitor.

3. A device according to claim 1, comprising one or more magnets and at least one coil which is configured such that it will conduct the induced signal as the mirror oscillates.

4. A device according to claim 1, wherein the device comprises a single coil which is attached to the mirror, wherein the single coil is configured to conduct both the oscillation signal and the induced signal as the mirror oscillates.

5. A device according to claim 1, wherein the device comprises a first and second coil, wherein the first coil is configured to conduct the oscillation signal and the second coil is configured to conduct the induced signal.

6. A device according to claim 5, wherein the first and second coils are attached to a part of the device which oscillates as the mirror oscillates.

7. A device according to claim 5, wherein the first and second coils are arranged in the device such to reduce cross coupling between the first and second coils.

8. A device according to claim 5, further comprising a shield means which prevents cross coupling between the first and second coils.

9. A device according to claim 5, wherein the first coil is attached to a part of the device which oscillates as the mirror oscillates; and the second coil is attached to a fixed part of the device, such that as the mirror oscillates, the magnetic field provided by the one or more magnets and the movement and the first coil which conducts the oscillation signal, can induce the induced signal in the second coil.

10. A device according to claim 1, further comprising a circuit which is configured to remove a parasitic component in the filtered signal.

11. A device according to claim 1, further comprising,
a circuit, which is configured to receive the induced signal and the oscillation signal provided by the circuit, and to compare the induced signal with the oscillation signal, and to provide a control signal based on the comparison;
an oscillator circuit, wherein the oscillator circuit is controlled by the control signal provided by the circuit such that the oscillator circuit provides an oscillation signal which will adjust the oscillation of the mirror so that the mirror oscillates closer to the resonant frequency of the mirror.

12. The device according to claim 11, wherein the oscillator circuit is arranged such that the oscillating signal defines a clock signal for a circuit.

13. The device according to claim 11, further comprising a means for dividing frequency of an oscillating signal which is provided by the oscillator circuit.

14. The device according to claim 11, further comprising a rectifier means which is configured to modify the control signal which controls the oscillator circuit so as to compensate for sinus movement of the mirror as the mirror oscillates.

15. The device according to claim 11, further comprising a switch device which is selectively operable to provide a constant signal, wherein the constant signal is equal to an output of the circuit which is configured to compare the induced signal with the oscillation signal, at the instant the switching device is switched.

* * * * *